(12) United States Patent
Streefkerk et al.

(10) Patent No.: US 7,817,245 B2
(45) Date of Patent: Oct. 19, 2010

(54) LITHOGRAPHIC APPARATUS AND DEVICE MANUFACTURING METHOD

(75) Inventors: Bob Streefkerk, Tilburg (NL);
Johannes Catharinus Hubertus Mulkens, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 421 days.

(21) Appl. No.: 11/984,060

(22) Filed: Nov. 13, 2007

(65) Prior Publication Data

US 2008/0068577 A1 Mar. 20, 2008

Related U.S. Application Data

(62) Division of application No. 10/951,029, filed on Sep. 28, 2004, now abandoned.

(30) Foreign Application Priority Data

Sep. 29, 2003 (EP) .................. 03256096

(51) Int. Cl.
*G03B 27/42* (2006.01)
*G03B 27/52* (2006.01)
(52) U.S. Cl. .......................... 355/53; 355/30
(58) Field of Classification Search ............. 355/30, 355/53, 67–69; 250/548
See application file for complete search history.

(56) References Cited

U.S. PATENT DOCUMENTS

| | | | | |
|---|---|---|---|---|
| 3,573,975 A | 4/1971 | Dhaka et al. | ................. | 117/212 |
| 3,648,587 A | 3/1972 | Stevens | .......................... | 95/44 |
| 4,346,164 A | 8/1982 | Tabarelli et al. | ............. | 430/311 |
| 4,390,273 A | 6/1983 | Loebach et al. | ............. | 355/125 |
| 4,396,705 A | 8/1983 | Akeyama et al. | ............ | 430/326 |
| 4,480,910 A | 11/1984 | Takanashi et al. | ............. | 355/30 |
| 4,509,852 A | 4/1985 | Tabarelli et al. | ................ | 355/30 |
| 5,040,020 A | 8/1991 | Rauschenbach et al. | ........ | 355/53 |
| 5,610,683 A | 3/1997 | Takahashi | ..................... | 355/53 |
| 5,715,039 A | 2/1998 | Fukuda et al. | ................. | 355/53 |
| 5,825,043 A | 10/1998 | Suwa | .......................... | 250/548 |
| 5,900,354 A | 5/1999 | Batchelder | ................... | 430/395 |
| 6,191,429 B1 | 2/2001 | Suwa | .......................... | 250/548 |
| 6,236,634 B1 | 5/2001 | Lee et al. | ..................... | 369/112 |

(Continued)

FOREIGN PATENT DOCUMENTS

DE 206 607 2/1984

(Continued)

OTHER PUBLICATIONS

M. Switkes et al., "Immersion Lithography at 157 nm", MIT Lincoln Lab, Orlando Jan. 2001, Dec. 17, 2001.

(Continued)

*Primary Examiner*—Hung Henry Nguyen
(74) *Attorney, Agent, or Firm*—Pillsbury Winthrop Shaw Pittman LLP (57) ABSTRACT

An immersion lithographic apparatus and method are disclosed in which measures are taken to account for dissolution of resist components, such as photo-acids or photo-acid generators, in immersion liquid. This may involve ensuring that each relevant part of the substrate is covered by liquid the same amount of time and/or by compensating for the differing amounts of time each relevant part of the substrate is covered by liquid by varying exposure intensity or duration based on the amount of time the substrate is covered by liquid.

20 Claims, 3 Drawing Sheets

U.S. PATENT DOCUMENTS

| | | |
|---|---|---|
| 6,560,032 B2 | 5/2003 | Hatano .................. 359/656 |
| 6,600,547 B2 | 7/2003 | Watson et al. |
| 6,603,130 B1 | 8/2003 | Bisschops et al. ........ 250/492.1 |
| 6,633,365 B2 | 10/2003 | Suenaga ................. 355/53 |
| 7,006,209 B2 | 2/2006 | Levinson ............... 356/128 |
| 7,073,542 B2 | 7/2006 | Iriguchi ................. 141/2 |
| 7,227,616 B2 * | 6/2007 | Graeupner .............. 355/53 |
| 2002/0020821 A1 | 2/2002 | Van Santen et al. ........ 250/492 |
| 2002/0163629 A1 | 11/2002 | Switkes et al. ............ 355/53 |
| 2003/0123040 A1 | 7/2003 | Almogy ................. 355/69 |
| 2003/0174408 A1 | 9/2003 | Rostalski et al. .......... 359/642 |
| 2004/0000627 A1 | 1/2004 | Schuster |
| 2004/0021844 A1 | 2/2004 | Suenaga |
| 2004/0075895 A1 | 4/2004 | Lin ..................... 359/380 |
| 2004/0109237 A1 | 6/2004 | Epple et al. |
| 2004/0114117 A1 | 6/2004 | Bleeker |
| 2004/0119954 A1 | 6/2004 | Kawashima et al. ........ 355/30 |
| 2004/0125351 A1 | 7/2004 | Krautschik .............. 355/53 |
| 2004/0135099 A1 | 7/2004 | Simon et al. |
| 2004/0136494 A1 | 7/2004 | Lof et al. |
| 2004/0160582 A1 | 8/2004 | De Smit et al. |
| 2004/0165159 A1 | 8/2004 | Lof et al. |
| 2004/0207824 A1 | 10/2004 | Lof et al. |
| 2004/0211920 A1 | 10/2004 | Derksen et al. |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immerision Optical Lithography at 193nm", Future Fab International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $\kappa_3$ coefficient in nonparaxial $\lambda$/NA scaling equations for resolution, depth of focus, and immersion lithography, *J. Microlith., Microfab., Microsyst.* 1(1):7-12 (2002).

* cited by examiner

LITHOGRAPHIC APPARATUS AND DEVICE MANUFACTURING METHOD

This application is a divisional application of U.S. patent application Ser. No. 10/951,029, filed Sep. 28, 2004, which is abandoned and which claims priority from European patent application EP 03256096.3, filed Sep. 29, 2003, each of the foregoing applications incorporated herein in its entirety.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

Figure 2:
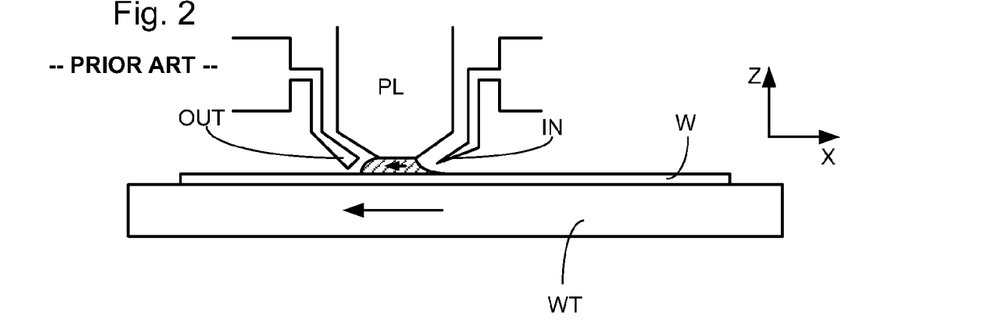
FIGS. 2 and 3 depict a liquid supply system for use in a lithographic projection apparatus.
Figure 3:
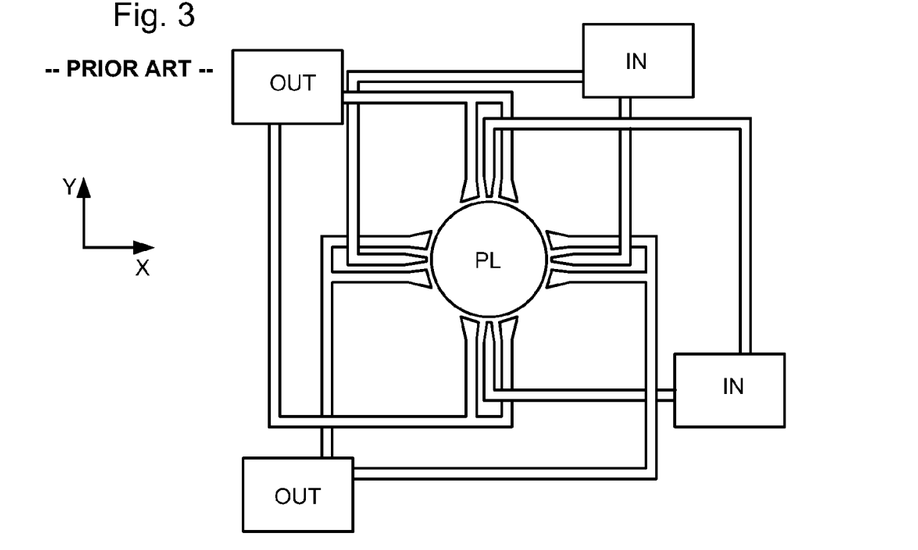

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

With an immersion lithography apparatus, there may be undesirable non-uniformities in the printed image, especially in the critical dimension (CD), between different areas of a substrate.

SUMMARY

Accordingly, it would be advantageous, for example, to provide an immersion lithographic apparatus in which the printed images in the resist have more uniform characteristics.

According to an aspect of the invention, there is provided a lithographic projection apparatus arranged to project a radiation beam patterned by a patterning device, through a liquid, onto a target portion of a substrate, the apparatus comprising:

a projection system configured to project the patterned beam onto a target portion of the substrate;

a liquid supply system configured to provide a liquid to a space between the projection system and the substrate; and a controller configured to operate the apparatus such that all target portions of the substrate to be projected with the patterned beam have liquid on them for a substantially equal length of time.

According to an aspect of the invention, there is provided a lithographic projection apparatus arranged to project a radiation beam patterned by a patterning device, through a liquid, onto a target portion of a substrate, the apparatus comprising:

a projection system configured to project the patterned beam onto the substrate;

a liquid supply system configured to provide a liquid to a space between the projection system and the substrate; and a controller configured to control an exposure dose of the patterned beam on a particular target portion of the substrate based on an amount of time the particular target portion has liquid on it.

According to an aspect of the invention, there is provided a device manufacturing method, comprising:

projecting a patterned beam of radiation, through a liquid provided in a space between a projection system of a lithographic apparatus and a substrate, onto a target portion of the substrate; and operating the lithographic apparatus such that all target portions of the substrate projected with the patterned beam have liquid on them for a substantially equal length of time.

According to an aspect of the invention, there is provided a device manufacturing method, comprising:

projecting a patterned beam of radiation, through a liquid provided between a projection system of a lithographic apparatus and a substrate, onto a target portion of the substrate; and controlling an exposure dose of the patterned beam on a particular target portion based on an amount of time the particular target portion has liquid on it.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
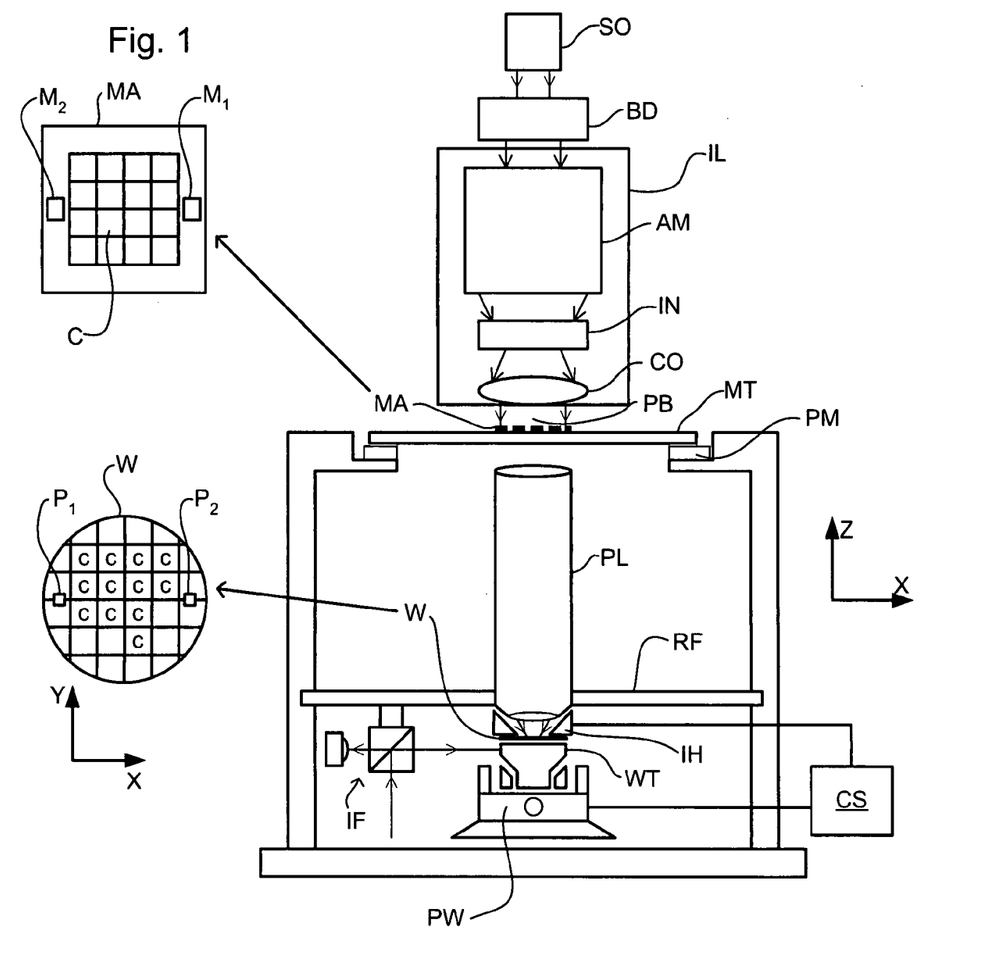
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam PB (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
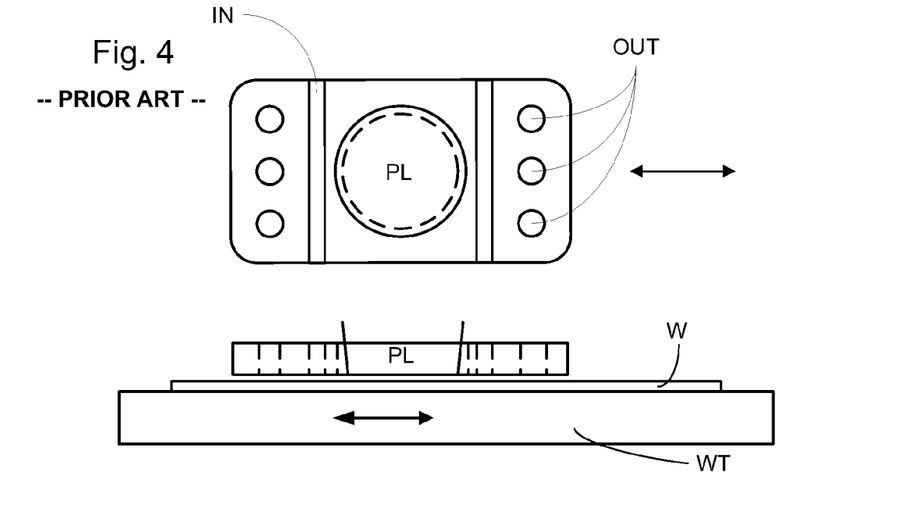
FIG. 4 depicts another liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another immersion lithography solution with a localized liquid supply system solution which has been proposed is to provide the liquid supply system with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal. Such a system with a gas seal is disclosed in U.S. patent application Ser. No. 10/705,783, hereby incorporated in its entirety by reference, and shown in FIG. 5.

Figure 5:
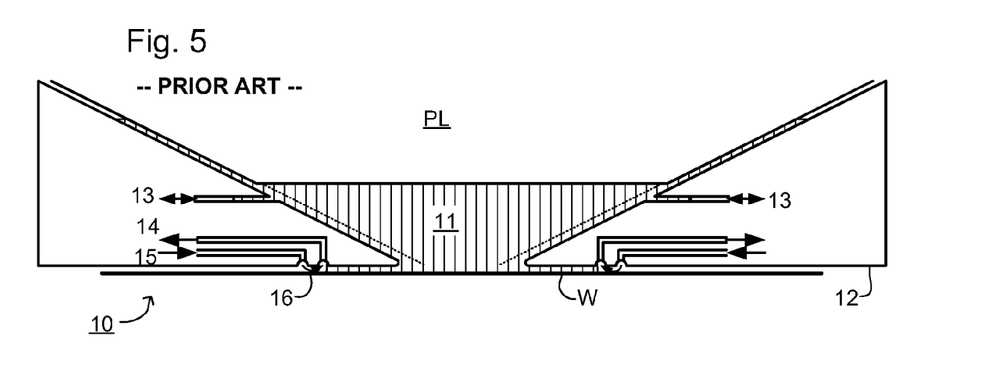
FIG. 5 depicts a liquid supply system according to an embodiment of the invention.

The liquid supply system IH, also referred to as the immersion hood, is shown in FIG. 5. As can there be seen, a reservoir 10 forms a contactless seal to the substrate around the image field of the projection system so that liquid is confined to fill a space between the substrate surface and the final element of the projection system. The reservoir is formed by a seal member 12 positioned below and surrounding the final element of the projection system PL. Liquid is brought into the space below the projection system and within the seal member 12. The seal member 12 extends a little above the final element of the projection system and the liquid level rises above the final element so that a buffer of liquid is provided. The seal member 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the seal member 12 and the surface of the substrate W. The gas seal is formed by gas, e.g. air or synthetic air or $N_2$ or an inert gas, provided under pressure via inlet 15 to the gap between seal member 12 and substrate and extracted via first outlet 14. The overpressure on the gas inlet 15, vacuum level on the first outlet 14 and geometry of the gap are arranged so that there is a high-velocity gas flow inwards that confines the liquid.

A unique problem that may occur with a liquid supply system which supplies liquid to only a localized area of the substrate (such as any of those described herein or otherwise known now or in the future) is if one or more areas of the substrate are in contact with the immersion liquid for different amounts of time. This problem may result because components of the resist (e.g., a photoresist), which covers the substrate W, dissolve in or react with the immersion liquid with time and immersion liquid diffuses into the resist with time so that the properties of the resist change with time of immersion. A target portion which has been in contact with immersion liquid for longer than another target portion may be patterned differently under the same exposure conditions. This typically has not been a problem with previous types of immersion apparatus such as those in which the whole substrate or substrate table are placed in a bath of liquid (see, e.g., U.S. Pat. No. 4,509,825).

According to an embodiment of the present invention, a controller CS is used to ensure that all areas of the substrate W which are to be imaged (i.e. all target portions) are covered in immersion liquid for a substantially equal length of time. Dissolution of components of the resist occurs both during imaging as well as after imaging. Diffusion of immersion liquid into the resist occurs both before, during and after imaging. Thus, the controller needs to operate the apparatus such that all target portions of the substrate have the immersion liquid on them for substantially equal length of time, perhaps even equal amounts of time before, equal amounts of time during and equal amounts of time after imaging.

One way of doing this is to choose a path of the substrate under the projection system PL to ensure that the criterion is met. This path is unlikely to be the optimal path which maximizes throughput of substrates but this disadvantage may be more than offset by the fact that all target portions can have the same exposure dose of projection beam which can be chosen for the particular pattern to be imaged and type of resist, duration of immersion, pattern to be imaged, wavelength etc.

An alternative or additional way in which it can be ensured that all parts of the substrate resist are covered by immersion liquid so that the criteria are met is to use a supplementary liquid supply system SLSS1, SLSS2 which can be used to place extra immersion liquid on the substrate W in areas outside of the localized area. This embodiment will be described with reference to FIG. 6. As can be seen from FIG. 6, a liquid supply system which has a liquid confinement system LCS is positioned around the final element of the projection system PL and forms a seal with the surface of the substrate W. In an embodiment, the seal is a gas seal 10 such as is shown in FIG. 5. The liquid confinement system LCS is in a stationary position in the XY plane relative to the projection system PL and the substrate W moves underneath the projection system PL such that the target portions on the substrate W are moved under the projection system PL. Liquid is supplied to the space between the final element of the projection system PL and the substrate W through inlet 20 in the liquid confinement system LCS.

Figure 6:
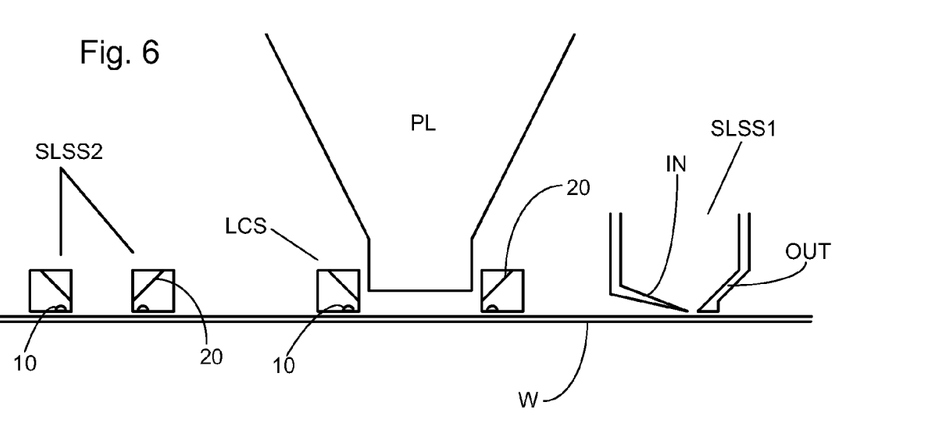
FIG. 6 depicts an apparatus in accordance with another embodiment of the present invention.

Two types of supplementary liquid supply systems SLSS1, SLSS2 are illustrated in FIG. 6. The first of the supplementary liquid supply systems SLSS1 is a liquid supply system similar to that illustrated in FIGS. 2 and 3 and described in detail in PCT patent application WO 99/49504, hereby incorporated in its entirety by reference. The second supplementary liquid supply system SLSS2 is similar to the liquid supply system positioned under the projection system PL in FIG. 6.

The apparatus may comprise any number of supplementary liquid supply systems SLSS1, SLSS2. The type of supplementary liquid supply system SLSS1, SLSS2 does not matter. In an embodiment, the supplementary liquid supply systems SLSS1, SLSS2 are localized liquid supply systems with liquid confinement systems LCS as illustrated in FIG. 6 which deposit and take up liquid thereby circulating the liquid and giving the opportunity to turn the liquid supply on and off. In this way the portions of the substrate W which are exposed to immersion liquid can easily be selected to achieve the desired result. The supplementary liquid supply system may be moveable in the XY plane and may be turned on and off (i.e. so that one or more of them are either full of liquid or empty) under the control of the controller.

A third way of accounting for the dissolution of components of the resist in the immersion liquid is for the controller to calculate the effect that the immersion liquid has had or will have on the resist based on data in a database (which may be experimental results) i.e. feed forward control. The controller, based on these calculations, adjusts the exposure dose (imaging parameters) so that all target portions, once the resist has been developed, will be optimally exposed (i.e. compensated for degree of dissolution of components of the resist). For a positive resist, longer immersion in immersion liquid is likely to require a higher exposure dose.

The imaging parameters or exposure characteristics which is/are changed to vary the exposure dose is/are likely to be the exposure intensity and/or duration of exposure. In this way the substrate can be moved under the projection system PL in a path which is optimum for throughput but which does not suffer from certain areas of the substrate being exposed more or less than average to the immersion liquid. Of course, the apparatus can be programmed in such a way that exposure doses are chosen as a function of location of the target portion on the substrate W. This data may be based on experimental, such as CD, measurements or modeling results so that the controller does not actually perform any calculation. The exposure dose might be controlled on another basis in a closed loop such as by analysis of the immersion liquid composition or pH for example which will be dependent on the amount of dissolution of components of the resist in or diffusion into the resist of immersion liquid.

It is possible that all three or any combination of the ways of compensating for dissolution of components of the resist or diffusion of liquid into the resist are employed at one time.

Thus, according to an embodiment of the present invention, the dissolution of components of the resist on the surface of the substrate in the immersion liquid and/or diffusion of immersion liquid into the resist may be accounted for. A problem is that as the components of the resist dissolve, the characteristics of the effect of impingement of the patterned beam on the target portion changes, so that there is a change in the critical dimension achievable with time of contact with immersion liquid. The apparatus according to an embodiment of the present invention attempts to solve this problem by two means:

the apparatus ensures that each part of the substrate which is to be imaged (i.e. each target portion) is immersed in immersion liquid for substantially the same amount of time; and/or the apparatus takes into account how long the target portion of the substrate has been immersed in immersion liquid and applies a correction to the projected patterned beam to account for this. Thus, if a particular target portion has been immersed longer than average for the substrate, the intensity or duration of projection of the patterned beam on that target portion will need to be increased or decreased according to the particular circumstance (e.g. type of feature, type of immersion liquid, type of resist etc.). If the target portion has been immersed less than average, the projected patterned beam will also need to be adjusted.

One way for the controller to ensure that the apparatus compensates for critical dimension changing due to immersion of the resist in immersion liquid is by operating the apparatus by moving the substrate such that each target portion on the substrate has immersion liquid provided by the liquid supply system on it for the substantially equal length of time. Thus the path of the substrate under the projection system which is chosen ensures that the substrate meanders under the projection system PL such that each target portion is part of the localized area for the same amount of time as all other target portions.

Another way of ensuring that each target portion is immersed for the same amount of time in immersion liquid is to provide a supplementary liquid supply system configured to provide immersion liquid to the substrate outside of the localized area and wherein the controller is for operating the apparatus by applying the immersion liquid outside of the localized area using the supplementary liquid supply system. In this way target portions which, for some reason, are under the projection system and thereby immersed in immersion liquid by the liquid supply system less than average, can have their exposure to immersion liquid "topped up" to a certain level by use of the supplementary liquid supply system.

In European Patent Application No. 03257072.3, the idea of a twin or dual stage immersion lithography apparatus is disclosed. Such an apparatus is provided with two stages for supporting the substrate. Leveling measurements are carried out with a stage at a first position, without immersion liquid, and exposure is carried out with a stage at a second position, where immersion liquid is present. Alternatively, the apparatus has only one stage.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The present invention can be applied to any immersion lithography apparatus, in particular, but not exclusively, those types mentioned above.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus arranged to project a radiation beam patterned by a patterning device, through a liquid, onto a target portion of a substrate, the apparatus comprising:
    a projection system configured to project the patterned beam onto the substrate;
    a liquid supply system configured to provide a liquid to a space between the projection system and the substrate; and
    a controller configured to control an exposure dose of the patterned beam on a particular target portion of the substrate based on an amount of time the particular target portion has liquid on it.

2. The apparatus according to claim 1, wherein the amount of time is time before, time after or both time before and time after projection of the patterned beam on the particular target portion.

3. The apparatus according to claim 1, wherein the controller is configured to control an exposure intensity of the patterned beam, a duration of exposure using the patterned beam, or both.

4. The apparatus according to claim 1, wherein controller is configured to chose the exposure dose as a function of the location of the particular target portion on the substrate.

5. The apparatus according to claim 1, wherein the controller is configured to chose the exposure dose based on an analysis of the liquid.

6. The apparatus according to claim 1, wherein the controller is configured to calculate an effect that the liquid has had or will have on a resist on the substrate.

7. The apparatus according to claim 1, wherein the controller is configured to operate the apparatus such that all target portions of the substrate to be projected with the patterned beam have liquid on them for a substantially equal length of time.

8. The apparatus according to claim 7, further comprising a supplementary liquid supply system configured to provide a liquid on the substrate outside of a localized area to which the liquid supply system provides the liquid to the space and wherein the controller is configured to operate the apparatus to apply liquid outside of the localized area using the supplementary liquid supply system.

9. The apparatus according to claim 7, wherein the substantially equal length of time is time before, time after or both time before and time after projection of the patterned beam on the target portion.

10. The apparatus according to claim 1, wherein the controller is configured to operate the apparatus by moving the substrate such that each target portion of the target portions of the substrate to be projected with the patterned beam has liquid provided by the liquid supply system on it for a substantially equal length of time.

11. A device manufacturing method, comprising:
    projecting a patterned beam of radiation, through a liquid provided between a projection system of a lithographic apparatus and a substrate, onto a target portion of the substrate; and
    controlling an exposure dose of the patterned beam on a particular target portion based on an amount of time the particular target portion has liquid on it.

12. The method according to claim 11, wherein the amount of time is time before, time after or both time before and time after projecting the patterned beam of radiation onto the target portion.

13. The method according to claim 11, wherein controlling the exposure dose comprises controlling an exposure intensity of the patterned beam, controlling a duration of exposure using the patterned beam, or both.

14. The method according to claim 11, wherein controlling the exposure dose comprises choosing the exposure dose as a function of the location of the particular target portion on the substrate.

15. The method according to claim 11, wherein controlling the exposure dose comprises choosing the exposure dose based on an analysis of the liquid.

16. The method according to claim 11, wherein controlling the exposure dose comprises calculating an effect that the liquid has had or will have on a resist on the substrate.

17. The method according to claim 11, comprising operating the lithographic apparatus such that all target portions of the substrate projected with the patterned beam have liquid on them for a substantially equal length of time.

18. The method according to claim 17, wherein operating the lithographic apparatus comprises applying a liquid outside of a localized area on the substrate to which the liquid is or was provided to the space.

19. The method according to claim 17, wherein the substantially equal length of time is time before, time after or both time before and time after projecting the patterned beam of radiation onto the target portion.

20. The method according to claim 11, comprising operating the lithographic apparatus such that each target portion of the target portions of the substrate projected with the patterned beam has liquid provided by a liquid supply system on it for a substantially equal length of time.

* * * * *